United States Patent [19]

Uemura et al.

[11] Patent Number: 4,994,896
[45] Date of Patent: Feb. 19, 1991

[54] SEMICONDUCTOR DEVICE

[75] Inventors: Shunichi Uemura; Yashuhiro Murasawa, both of Itami, Japan

[73] Assignee: Mitsubishi Denki Kabushiki Kaisha, Tokyo, Japan

[21] Appl. No.: 194,944

[22] Filed: May 17, 1988

[30] Foreign Application Priority Data

May 27, 1987 [JP] Japan .................. 62-130683

[51] Int. Cl.$^5$ ............ H01L 23/02; H01L 23/12
[52] U.S. Cl. ............................ 357/74; 357/75
[58] Field of Search ............ 357/74, 75, 70, 80; 361/412, 413, 421

[56] References Cited

U.S. PATENT DOCUMENTS

| 4,482,781 | 11/1984 | Burns ............... | 357/74 |
| 4,651,192 | 3/1987 | Matsushita et al. ....... | 357/74 |
| 4,682,207 | 7/1987 | Akasaki et al. ......... | 357/74 |
| 4,771,366 | 9/1988 | Blake et al. ........... | 357/81 |

FOREIGN PATENT DOCUMENTS

| 0140468 | 10/1979 | Japan ........ | 357/74 |
| 58-159360 | 9/1983 | Japan ........ | 357/75 |
| 60-220955 | 11/1985 | Japan ........ | 357/75 |

OTHER PUBLICATIONS

Iafrate, "High Density and Speed Performance Chip Joining Procedure and Package", IBM Tech. Disclosure Bulletin, vol. 15, No. 4, 9/72, p. 1281.

Primary Examiner—Rolf Hille
Assistant Examiner—Hoanganh Le
Attorney, Agent, or Firm—Oblon, Spivak, McClelland, Maier & Neustadt

[57] ABSTRACT

Two types of semiconductor packages (6a, 6b), being different in direction of bending of external lead terminals (3) from each other, are prepared to be mounted on a single surface or both surfaces of a package substrate. In case of single-surface mounting, the external lead terminals (3) of the same pin numbers can be electrically connected with each other by drawing around wires (9). In case of double-surface mounting, the external lead terminals (3) of the same pin numbers can be electrically connected with each other by through holes.

5 Claims, 5 Drawing Sheets

SEMICONDUCTOR DEVICE

BACKGROUND OF THE INVENTION

1. Field of the Invention

The present invention relates to a semiconductor device which is formed by mounting semiconductor packages having integrated circuits on a package substrate.

2. DESCRIPTION OF THE PRIOR ART

FIG. 1A is a plan view showing a small outline package having external lead terminals downwardly bent with respect to a package surface thereof (hereinafter referred to as an A-type package) and FIG. 1B is a side elevational view of the A-type package, while FIG. 1C is a front elevational view of the A-type package and FIG. 1D is a sectional view thereof. As shown in FIG. 1D, a semiconductor chip 2 is placed on a die pad 1. A bonding pad (not shown) provided on the semiconductor chip 2 is electrically connected with external lead terminals 3 by bonding wires 4. The die pad 1, the semiconductor chip 2, parts of the external lead terminals 3 and the bonding wires 4 are packaged by mold resin 5, to form a small outline package 6a whose appearance is as shown in FIGS. 1A to 1C. This package 6a is characterized in that the external lead terminals 3 are downwardly bent at an angle of about 90° with respect to a package surface thereof as shown in FIGS. 1B to 1D, while forward end portions of the external lead terminals 3 are further bent at an angle of about 90° to outwardly extend from the package 6a.

Such forward end portions of the external lead terminals 3 serve as soldering portions 7 to be soldered to a package substrate as hereinafter described. Referring to FIG. 1A, the lower leftmost external lead terminal 3 is referred to as a pin $p_1$ and the lower rightmost external lead terminal 3 is referred to as a pin $p_{14}$, while the upper rightmost external lead terminal 3 is referred to as a pin $p_{15}$ and the upper leftmost external lead terminal 3 is referred to as a pin $p_{28}$, for convenience of the following description.

FIG. 2 illustrates a semiconductor device having a package substrate 8 which is provided on both surfaces with a pair of A-type packages 6a as shown in FIGS. 1A to 1D. One of the A-type packages 6a is mounted on a first surface of the package substrate 8. The other A-type package 6a is mounted on a second surface of the package substrate 8 in correspondence to the package 6a mounted on the first surface.

FIG. 3 illustrates a semiconductor device having a package substrate 8 which is provided on its one surface with a plurality of A-type packages 6a as shown in FIGS. 1A to 1D. As shown in FIG. 3, such A-type packages 6a are mounted to be substantially parallel to each other.

FIG. 4 is a partially fragmented sectional view for illustrating a method of mounting such a package on the package substrate 8. First, solder 10 is previously applied to a mounting pad 9 of each electrode portion formed on the surface of the package substrate 8, as shown in FIG. 4. Then a package 6a is so mounted on the package substrate 8 as to bring a soldering portion 7 into prescribed positional relation to the mounting pad 9. Thereafter the soldering portion 7 is soldered to the mounting pad 9 to be electrically and mechanically connected to the same by the solder 10, thereby to complete mounting.

Consider such case where a pair of packages 6a are mounted on both surfaces of the package substrate 8 as shown in FIG. 2, so that external lead terminals 3 of the packages 6a having the same pin numbers are connected with each other. In this case, it is impossible to connect the external lead terminals 3 having the same pin numbers by merely connecting the external lead terminals 3 of the pair of packages 6a through holes provided on the package substrate 8. This is because the external lead terminals 3 having the same pin numbers are not rendered opposite to each other in the structure as shown in FIG. 2. For example, the pin $p_1$ within the external lead terminals 3 of the package 6a mounted on the first surface of the package substrate 8 is rendered opposite to the pin $p_{14}$ or $p_{28}$ within the external lead terminals 3 of the package 6a provided on the second surface of the package substrate 8.

Further, consider such case where the three or more pairs of external lead terminals 3 having the same pin numbers are connected with each other within those of a pair of packages 6a provided on one surface of the package substrate 8. In this case, it is impossible to connect the external lead terminals 3 of the packages 6a having the same pin umbers with each other by simply drawing around wires 12 on the surface carrying the packages 6a. This is because the wires 12 inevitably intersect with each other in any position to cause a short. When pins $p_1$, $p_{14}$, $p_{15}$ and $p_{28}$ of the two packages 6a are connected with each other as shown in FIG. 3, for example, the wires 12 inevitably intersect with each other in two positions. Therefore, jumper wires and through holes 13 as shown in FIG. 3 must be provided in such positions, in order to prevent shorting by avoiding such intersection of the wires 12.

SUMMARY OF THE INVENTION

A first invention comprises a first semiconductor package having external lead terminals upwardly bent with respect to a package surface thereof; a second semiconductor package having external lead terminals downwardly bent with respect to a package surface thereof; a package substrate mounted on one surface with the first and second semiconductor packages through the external lead terminals respectively; and connecting means for electrically connecting the external lead terminals of the first semiconductor package with corresponding ones of the external lead terminals of the second semiconductor package.

A second invention comprises a first semiconductor package having external lead terminals upwardly bent with respect to a package surface thereof; a second semiconductor package having external lead terminals downwardly bent with respect to a package surface thereof, a package substrate mounted on a first surface with the first semiconductor package through the external lead terminals thereof as well as mounted on a second surface with the second semiconductor package through the external lead terminals thereof in correspondence to the first semiconductor package; and connecting means for electrically connecting the external lead terminals of the first semiconductor package with corresponding ones of the external lead terminals of the second semiconductor package.

Accordingly, a principal object of the present invention is to provide a semiconductor device which can electrically connect external lead terminals of the same pin numbers by simply drawing around wires in single-surface mounting of semiconductor packages.

Another object of the present invention is to provide a semiconductor device which can electrically connect external lead terminals of the same pin numbers only by through holes in double-surface mounting of semiconductor packages.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
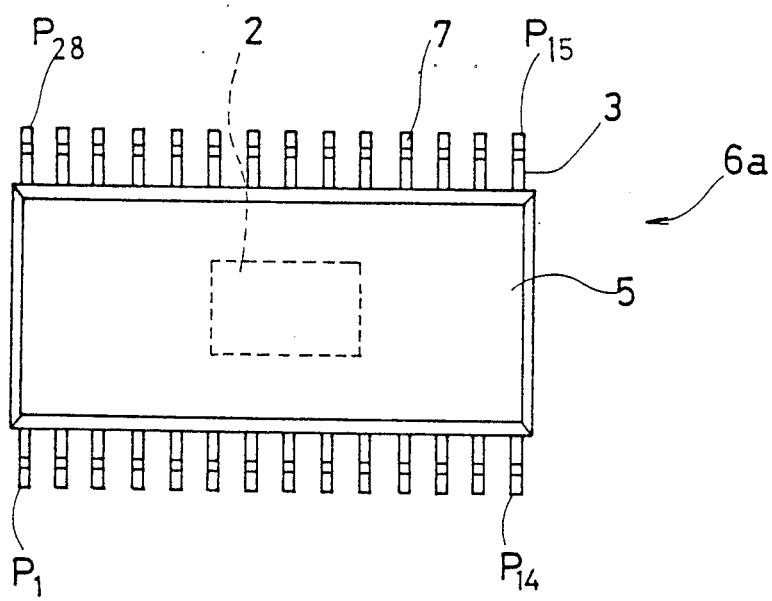
FIG. 1A is a plan view showing an A-type package.
Figure 1B:
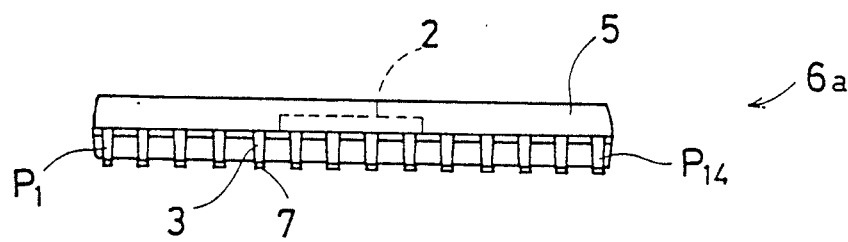
FIG. 1B is a side elevational view showing the A-type package.
Figure 1C:
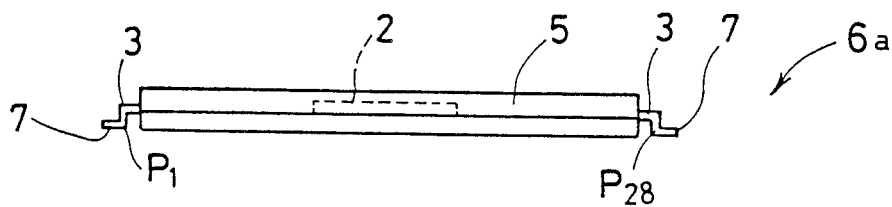
FIG. 1C is a front elevational view showing the A-type package.
Figure 1D:
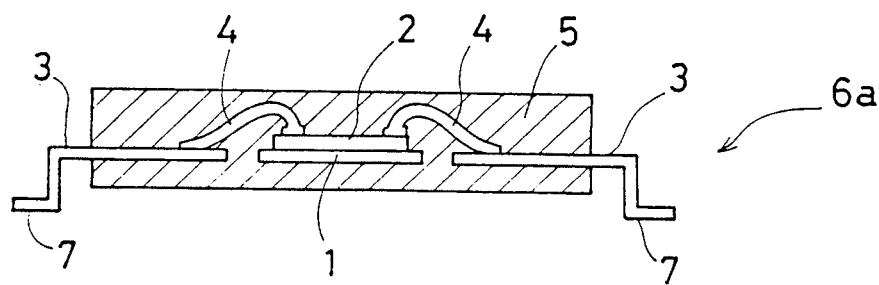
FIG. 1D is a sectional view showing the A-type package.
Figure 5A:
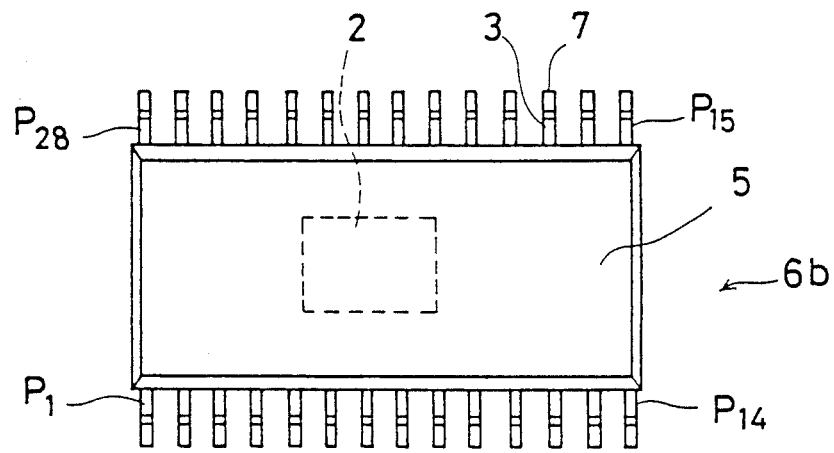
FIG. 5A is a plan view showing a package having upwardly bent external lead terminals (hereinafter referred to as a B-type package)
Figure 5B:
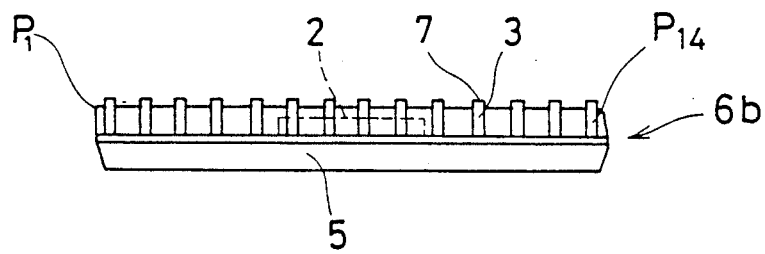
FIG. 5B is a side elevational view showing the B-type package.
Figure 5C:
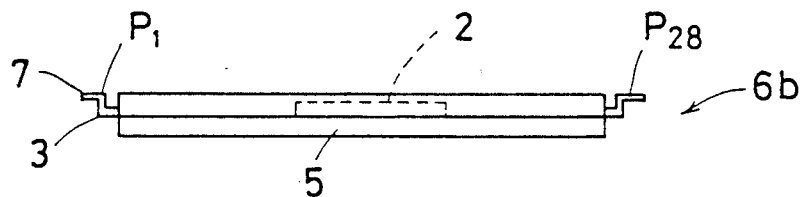
FIG. 5C is a front elevational view showing the B-type package.
Figure 5D:
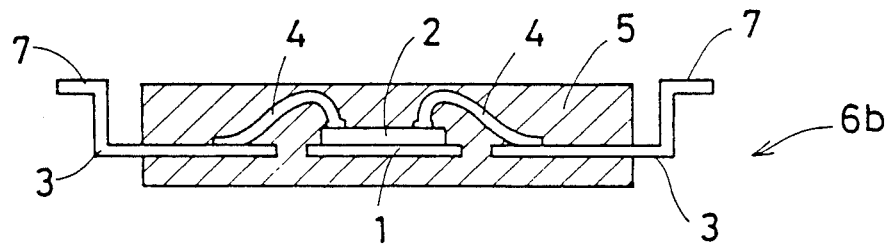
FIG. 5D is a sectional view showing the B-type package.

FIG. 5A is a plan view showing a B-type small outline package and FIG. 5B is a side elevational view thereof, while FIG. 5C is a front elevational view thereof and FIG. 5D is a sectional view thereof. The B-type package is different from the aforementioned A-type package in that external lead terminals 3 are upwardly bent at an angle of about 90° with respect to a package surface thereof as shown in FIG. 5D, dissimilarly to those of the A-type package as shown in FIG. 1D. The B-type package is absolutely identical in other structure to the A-type package.

Figure 2:
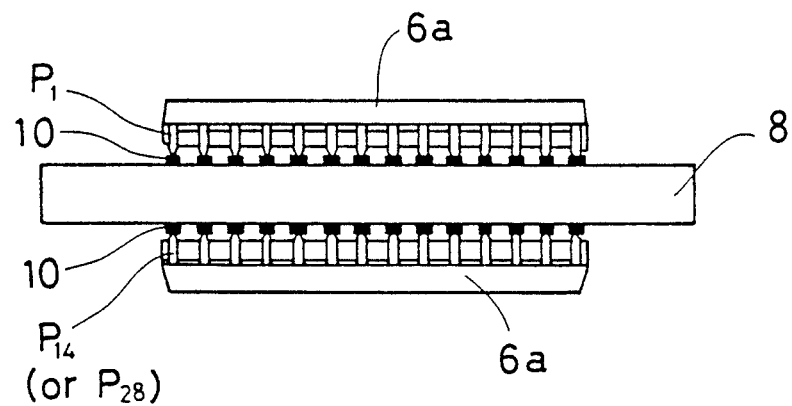
FIG. 2 illustrates a conventional semiconductor device having a package substrate which is mounted on both surfaces with a pair of A-type packages as shown in FIG. 1.
Figure 3:
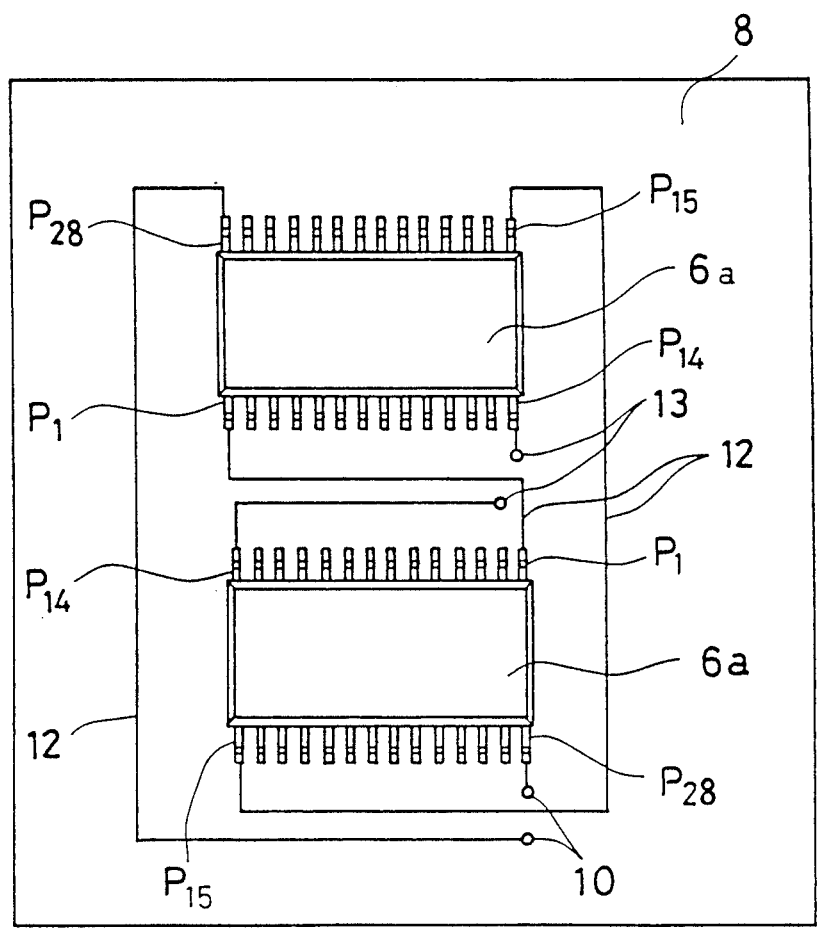
FIG. 3 illustrates a conventional semiconductor device having a package substrate which is mounted on its one surface with a pair of A-type packages as shown in FIG. 1.
Figure 4:
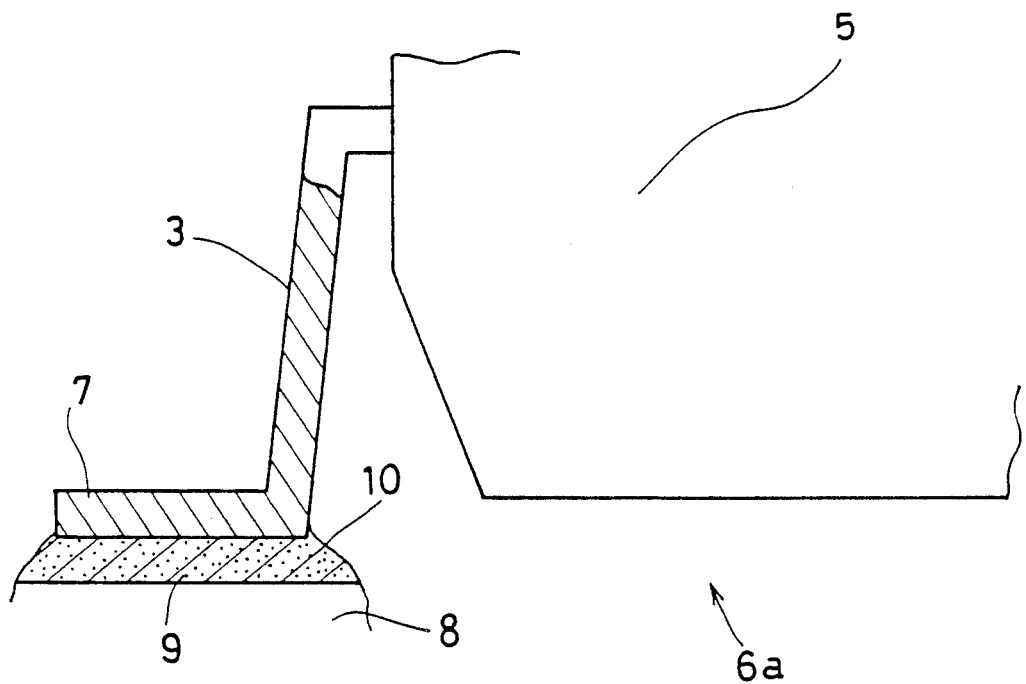
FIG. 4 is a partially fragmented sectional view for illustrating a method of mounting a package on a package substrate.
Figure 6:
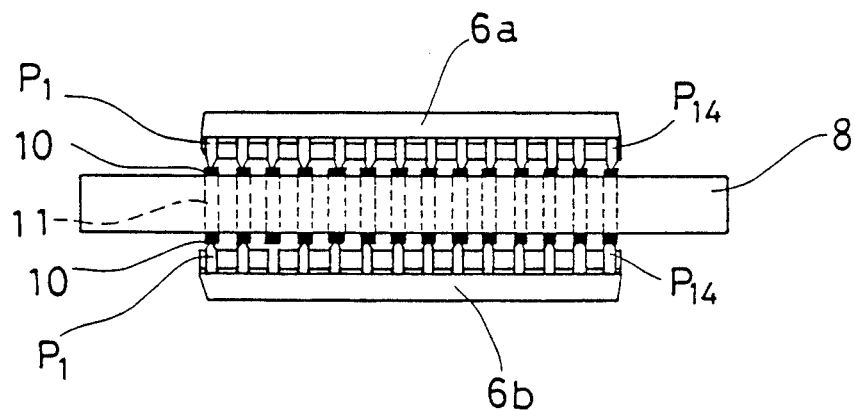
FIG. 6 illustrates a semiconductor device according to an embodiment of a first invention.

FIG. 6 illustrates a semiconductor device according to an embodiment of a first invention. Referring to FIG. 6, numerals identical to those of FIG. 2 indicate the same components. An A-type package 6a as shown in FIGS. 1A to 1D is mounted on a first surface of a package substrate 8. A B-type package 6b as shown in FIGS. 5A to 5D is mounted on a second surface of the package substrate 8 in correspondence to the A-type package 6a mounted on the first surface of a package substrate 8.

Figure 7:
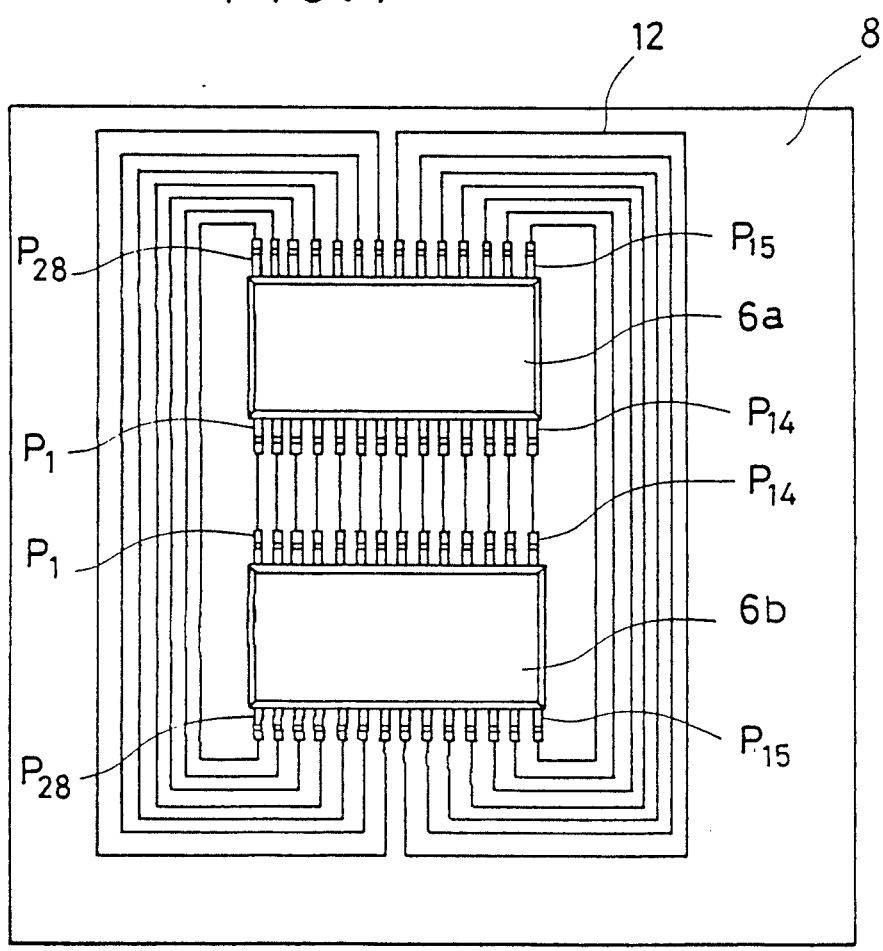
FIG. 7 illustrates a semiconductor device according to an embodiment of a second invention.

FIG. 7 illustrates a semiconductor device having a package substrate 8 which is mounted on its one surface with an A-type package 6a as shown in FIGS. 1A to 1D and a B-type package 6b as shown in FIGS. 5A to 5D. As shown in FIG. 7, the A-type package 6a and the B-type package 6b are mounted on one surface of the package substrate 8 substantially in parallel to each other.

The packages are mounted on the package substrate 8 in a similar manner to the conventional one, and hence redundant description is omitted.

Consider such case where, within external lead terminals 3 of the packages 6a and 6b mounted on the package substrate 8, those having the same pin numbers are connected to each other.

In the case of double-surface mounting as shown in FIG. 6, the external lead terminals 3 of the packages 6a and 6b having the same pin numbers are opposite to each other. For example, a pin $p_1$ of the package 6a mounted on the first surface of the package substrate 8 corresponds to an external lead terminal 3, indicated as a pin $p_1$, of the package 6b mounted on the second surface of the package substrate 8. Thus, the external lead terminals 3 having the same pin numbers can be electrically connected with each other by simply forming through holes 11 in positions of the package substrate 8 corresponding to the external lead terminals 3 to be connected and filling up the through holes 11 by conductive materials.

In the case of single-surface mounting as shown in FIG. 7, external lead terminals 3 of the package 6a are located in positions linearly symmetrical to external lead terminals 3 of the package 6b having the same pin numbers. Thus, the external lead terminals 3 of the same pin numbers in the packages 6a and 6b can be electrically connected with each other simply by drawing around wires 12, with no intersection of the wires 12 or no provision of through holes or jumper wires.

While small outline packages 6a and 6b are described above, the present invention can also be applied to a plastic leaded chip carrier or a small outline package with J lead. In other words, the present invention is applicable to all types of surface-mounting type packages.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising
a first semiconductor package having external lead terminals arranged according to a predetermined configuration and upwardly bent with respect to a package surface thereof;
a second semiconductor package having external lead terminals arranged according to the same predetermined configuration as said first semiconductor package and downwardly bent with respect to a package surface thereof;
a package substrate having said first semiconductor package thereof mounted on one surface whereby the upward surface of said first package faces a first surface of said package substrate and having mounted on the first surface of said package substrate said second semiconductor package such that the downward surface of said second package faces said first surface of said package substrate; and connecting means for electrically connecting said external lead terminals of said first semiconductor package with corresponding ones of said external lead terminals of said second semiconductor package.

2. A semiconductor device in accordance with claim 1, wherein
said first and second semiconductor packages are mounted substantially in a parallel manner to each other.

3. A semiconductor device in accordance with claim 1, wherein
said connecting means is formed by wires provided on said one surface of said package substrate.

4. A semiconductor device comprising:
a first semiconductor package having external lead terminals arranged in a predetermined configuration and upwardly bent with respect to a first package surface thereof;
a second semiconductor package having external lead terminals arranged in the same predetermined configuration as said first semiconductor package and downwardly bent with respect to a first package surface thereof;
a package substrate having mounted on a first surface said first semiconductor package such that said first package surface of said first semiconductor package is facing said first surface of said substrate and said second semiconductor package mounted on a second surface of said package substrate such that said first package surface of said second semiconductor package faces said second surface of said package substrate; and
connecting means for electrically connecting said external lead terminals of said first semiconductor package with corresponding ones of said external lead terminals of said second semiconductor package.

5. A semiconductor device in accordance with claim 4, wherein
said connecting means is formed by filling up conductive materials into through holes which is provided in said package substrate to pass through regions held by said external lead terminals of said first semiconductor package and said corresponding ones of said external lead terminals of said second semiconductor package.

* * * * *

UNITED STATES PATENT AND TRADEMARK OFFICE
CERTIFICATE OF CORRECTION

PATENT NO.   :   4,994,896

DATED        :   February 19, 1991

INVENTOR(S)  :   UEMURA, et al

It is certified that error appears in the above-identified patent and that said Letters Patent is hereby corrected as shown below:

ON THE TITLE PAGE,   ITEM[75] INVENTORS:

The second inventor's name is spelled incorrectly,

"Yashuhiro" should be --Yasuhiro--

Signed and Sealed this

Fifteenth Day of September, 1992

Attest:

DOUGLAS B. COMER

Attesting Officer

Acting Commissioner of Patents and Trademarks